United States Patent
Ogasawara et al.

(10) Patent No.: US 6,943,109 B2
(45) Date of Patent: Sep. 13, 2005

(54) METHOD OF MANUFACTURING A SEMICONDUCTOR ELEMENT

(75) Inventors: Hiromi Ogasawara, Miyagi (JP); Masashi Takahashi, Miyagi (JP)

(73) Assignee: Oki Electric Industrial Co., Ltd., Tokyo (JP)

(*) Notice: Subject to any disclaimer, the term of this patent is extended or adjusted under 35 U.S.C. 154(b) by 0 days.

(21) Appl. No.: 10/616,996

(22) Filed: Jul. 11, 2003

(65) Prior Publication Data
US 2004/0072417 A1 Apr. 15, 2004

(30) Foreign Application Priority Data
Oct. 11, 2002 (JP) ........................................ 2002-298457

(51) Int. Cl.$^7$ .............................................. H01L 21/443
(52) U.S. Cl. ............................................................ 438/672
(58) Field of Search ................................ 438/597, 629, 438/637, 639, 648, 656, 667, 669, 672, 674, 675, 685

(56) References Cited

U.S. PATENT DOCUMENTS

| | | | |
|---|---|---|---|
| 5,084,413 A | * | 1/1992 | Fujita et al. ............... 438/675 |
| 5,498,768 A | * | 3/1996 | Nishitani et al. ........... 438/644 |
| 5,804,249 A | * | 9/1998 | Sukharev et al. ........... 427/99 |
| 6,066,366 A | * | 5/2000 | Berenbaum et al. ........ 438/648 |
| 2003/0003707 A1 | * | 1/2003 | Yamaha ....................... 438/618 |

FOREIGN PATENT DOCUMENTS

| | | | | |
|---|---|---|---|---|
| EP | 0328970 | | 8/1989 | |
| JP | 64-17866 | | 1/1989 | |
| JP | 64-73717 | | 3/1989 | |
| JP | 1-218018 | | 8/1989 | |
| JP | 3-270224 | | 12/1991 | |
| JP | 4-17336 | | 1/1992 | |
| JP | 06268077 A | * | 9/1994 | .......... H01L/21/90 |
| JP | 11-260823 | | 9/1999 | |
| JP | 2001-168076 | | 6/2001 | |

* cited by examiner

Primary Examiner—Carl Whitehead, Jr.
Assistant Examiner—Jennifer M Dolan
(74) Attorney, Agent, or Firm—Wenderoth, Lind & Ponack, L.L.P.

(57) ABSTRACT

A semiconductor element has an upper wiring layer and a lower wiring layer. The upper and lower wiring layers communicate with each other via a via-hole. The via-hole is filled with W. Before W is filled in the via-hole by a CVD process to connect the lower wiring layer to the upper wiring layer, a cleaning gas is supplied into the via-hole to remove particular substances, which would otherwise result in high resistance. Subsequent to the cleaning step, the W portion is formed in the via-hole. Since the high resistance substances are removed from the via-hole before the formation of the W portion, the semiconductor element (or the via-hole) has a low resistance and high reliability.

20 Claims, 3 Drawing Sheets

METHOD OF MANUFACTURING A SEMICONDUCTOR ELEMENT

BACKGROUND OF THE INVENTION

1. Field of the Invention

The present invention generally relates to a method of manufacturing semiconductor elements, and more particularly to a method of fabricating semiconductor elements having a multiwiring-layer structure (multi-level interconnection structure) in which a metal-filled low-resistance via-hole is formed in an interlayer dielectrics (insulating film).

2. Description of the Related Art

A conventional method for fabricating semiconductor elements is disclosed in, for example, Japanese Patent Kokai (Laid-open Publication) No. 11-260823.

FIG. 6 of the accompanying drawings illustrates a cross sectional view of a semiconductor element which is fabricated by such a conventional method.

In FIG. 6, reference numeral 1 designates a Si substrate, reference numeral 2 designates an insulating film (thin layer), reference numeral 3 designates a first wiring layer, reference numeral 4 designates an interlayer dielectrics (insulating film) reference numeral 5 designates a via-hole, reference numeral 6 designates an adhesive layer, reference numeral 7 designates a W plug, and reference numeral 8 designates a second wiring layer.

As understood from FIG. 6, the insulating layer 2, the first wiring layer 3, and the interlayer dielectrics 4 are formed on the Si substrate 1 in this order. The interlayer dielectrics 4 has the via-hole 5 which is formed by a photolithographic process and an etching process. The wall of the via-hole 5 is covered with the adhesive layer 6, and the W plug 7 is formed in the via-hole 5. After the via-hole 5 is filled with the W plug 7, the second wiring layer 8 is formed.

A process for forming the W plug 7 has two major steps. One step is a W nucleus (seed) forming step and the other step is a W main portion forming step (i.e., W fill-in step).

FIG. 7 of the accompanying drawings illustrates a flowchart of a process for forming the W plug with supplied gases.

The first step is a nucleation step for forming a W nucleus for the W plug 7 (sub-steps S1 and S2). In this step, layers are formed by using $WF_6$, $SiH_4$, and $H_2$, which are the main raw materials.

Specifically, in the first step, a wafer (Si substrate) is placed in a chamber (a device for forming the W plug) and is then heated to a temperature which is suitable for the W plug formation. Subsequently, a raw material gas $SiH_4$ is fed to the chamber to form a Si layer on an adhesive layer, and then another raw material gas $WF_6$ is additionally fed to the chamber to form a thin W film on the Si layer. This thin W film is called a W nucleus or seed. The $WF_6$ gas and the $SiH_4$ gas form the thin W film on the Si layer. It should be noted that the combination of the Si layer and the thin W film may be referred to as a "W nucleus."

The second step is a step for forming a main W portion (sub-step S3). In this step, the supply of the $SiH_4$ gas is stopped, and the W plug 7 is formed by using $WF_6$ and $H_2$ as the main raw materials.

In this procedure, after W films are formed in and over the via-hole 5 by a CVD (chemical vapor deposition) process, the surface is etched back to have only the W plug 7 remain in the via-hole 5.

When the via-hole 5 is provided on the first wiring layer 3, undesired substances 9, such as $TiO_x$, which result in high resistance, often remain on the first wiring layer 3. If these substances 9 remain in the via-hole 5 (or between the adhesive layer 6 and the W plug 7), the resulting semiconductor element (or the via-hole) has a high resistance.

SUMMARY OF THE INVENTION

It is therefore an object of the present invention to provide a method for manufacturing a semiconductor element which can eliminate high resistance substances from a via-hole so that the semiconductor element has a low resistance and high reliability.

According to a first aspect of the present invention, there is provided an improved method for manufacturing a semiconductor element. The semiconductor element has a lower wiring layer and an upper wiring layer. The lower and upper wiring layers communicate with each other by a via-hole. A fluorine compound gas having a reducing function is supplied into the via-hole to clean the via-hole. Then, a W nuclei is formed in the via-hole, and a W main portion is formed in the via-hole by, for example, a CVD process.

The fluorine compound gas has a cleaning function. The fluorine compound gas includes, for example, a $WF_6$ gas, a $NF_3$ gas, or a $SiF_4$ gas.

According to a second aspect of the present invention, there is provided another improved method for manufacturing a semiconductor element. The semiconductor element has a lower wiring layer and an upper wiring layer. These layers communicate with each other by a via-hole. After the via-hole is formed, a fluorine compound gas having a reducing function and a cleaning function is supplied into the via-hole to clean the inside of the via-hole and to form a part of a W nucleus in the via-hole. Subsequently, the remainder of the W nucleus is formed. After the W nucleus is formed, a W main portion is formed in the via-hole by, for example, a CVD process. The fluorine compound gas includes, for example, a $SiF_4$ gas.

According to a third aspect of the present invention, there is provided still another improved method for manufacturing a semiconductor element. The semiconductor element has a lower wiring layer and an upper wiring layer. These layers communicate with each other by a via-hole. After the via-hole is formed, a fluorine compound gas having a reducing function and a cleaning function is supplied into the via-hole to clean the inside of the via-hole and to form a part of a W nucleus. Subsequently, suitable gases, such as a $SiH_4$ gas and $WF_6$ gas, are supplied into the via-hole to form the remainder of the W nucleus. A W main portion is then formed by, for example, a CVD process.

Since unnecessary substances are removed from the via-hole before the W nucleus is formed, the via-hole and the semiconductor element can have a low resistance and high reliability.

Other objects, aspects and advantages of the present invention will become more apparent to those skilled in the art from the following detailed description and the appended claims when taken in conjunction with the accompanying drawings.

DETAILED DESCRIPTION OF THE INVENTION

Embodiments of the present invention will now be described in detail.

First Embodiment

Figure 1:
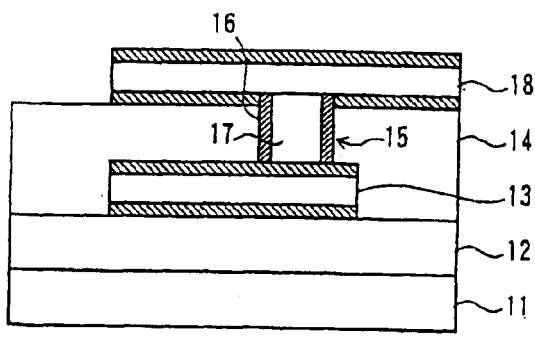
FIG. 1 illustrates a cross sectional view of a semiconductor element which is fabricated according to an embodiment of the present invention.

A first embodiment of the present invention is described with reference to FIG. 1 and FIG. 2. FIG. 1 shows a cross sectional view of a semiconductor element of the first embodiment.

As shown in FIG. 1, an insulating layer 12, a first wiring layer 13, and an interlayer dielectrics (insulating film) 14 are disposed on a Si substrate 11 in that order. The interlayer dielectrics 14 has a via-hole 15 which is formed by a photolithographic process and an etching process. The wall of the via-hole 15 is covered with an adhesive layer 16, and the via-hole 15 has a W plug 17 formed therein. The W plug 17 is created by vapor deposition. Reference numeral 18 represents a second wiring layer.

The procedure of filling the via-hole 15 with the W plug 17 (i.e., the process for forming the W plug 17) will be described with reference to FIG. 2.

Figure 2:
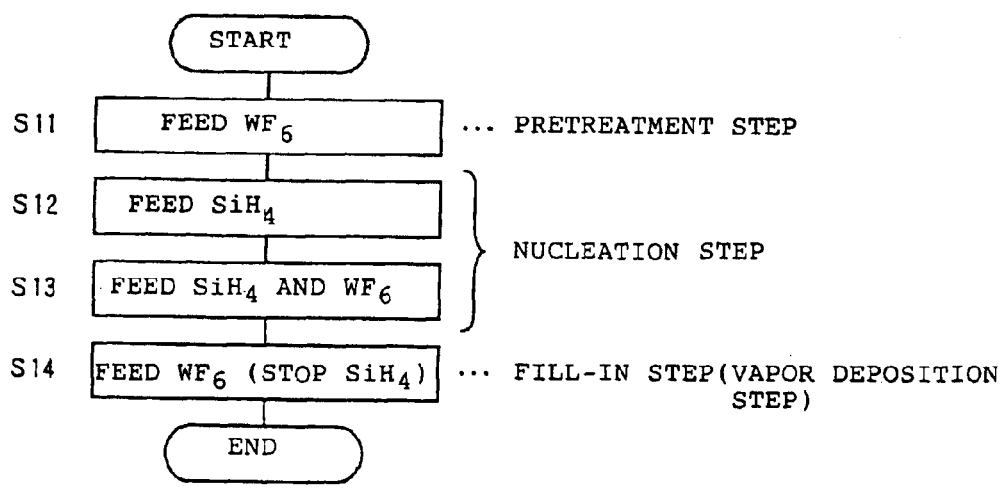
FIG. 2 is a flowchart showing a process for forming a W plug in a via-hole of the semiconductor element shown in FIG. 1 according to a first embodiment of the present invention.

FIG. 2 is a flowchart of the process for forming the W plug with gases which are supplied into the via-hole 15.

After the via-hole 15 is formed, the inside (particularly the bottom) of the via-hole 15 is cleaned by a sputtering process using, for example, Ar gas. The adhesive layer 16 is then formed over the wall of the via-hole 15. Subsequently, the inside (particularly the bottom) of the via-hole 15 is further cleaned by a pre-treatment (additional cleaning step). After the pre-treatment, the W plug 17 is formed by a CVD process to fill the via-hole 15.

In the first embodiment of the present invention, as shown in FIG. 2, the $WF_6$ gas is used to perform the pre-treatment cleaning step (sub-step S11) prior to the nucleation step (sub-steps S12 and S13). Subsequent to the pre-treatment (sub-step S11), the nucleation step (sub-steps S12 and S13) is conducted by using $SiH_4$ and $WF_6$, and the W deposition step (Step S14) is then conducted by using $H_2$ and $WF_6$ in the same manner as the conventional method.

Specifically, a wafer (Si substrate) is placed in a chamber (a device for forming the W plug) and is then heated to a temperature which is suitable for the W plug formation. Subsequently, the gas $SiH_4$ is fed to the chamber to form a Si layer on the adhesive layer 16, and then another raw material gas $WF_6$ is additionally fed to the chamber to form the thin W film on the Si layer 11. Subsequently, the gas $SiH_4$ is stopped, and the $WF_6$ gas and the $H_2$ gas are supplied to the chamber to deposit the W.

Since the sub-step S11 is employed, the first embodiment has the following advantages, when compared with the conventional method.

Figure 6:
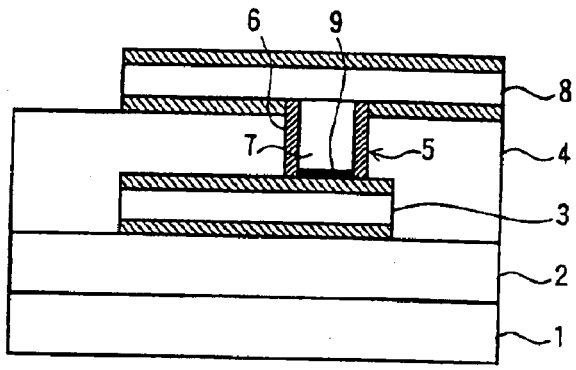
FIG. 6 is a cross sectional view of a conventional semiconductor element which is fabricated by a conventional method.

As shown in FIG. 6, the substances 9 including TiOx, which result in high resistance, exist at the bottom of the via-hole 5 after the via-hole 5 is created in the conventional method. It is assumed that the substances 9 are formed on the first wiring layer 3 during the process of making the via-hole 5. In the first embodiment of the present invention (FIG. 2), the Ar gas is supplied into the via-hole 15 to remove the substances 9 (sputtering process). However, the removal of the substances 9 by the Ar gas is often insufficient. Therefore, the $WF_6$ gas is introduced into the via-hole 15 in the first step (sub-step S11) before formation of the W plug 17. The substances 9 are therefore completely removed from the via-hole 15 by a cleaning effect of the $WF_6$ gas having a strong reducing function. Since the substances 9 do not exist inside the via-hole 15 (FIG. 1), the product (semiconductor element) has a low resistance.

Second Embodiment

A second embodiment of the present invention will now be described with reference to FIG. 1 and FIG. 3.

A semiconductor element which is fabricated in accordance with the second embodiment is the same as the semiconductor element shown in FIG. 1. Thus, the structure of the semiconductor element will not be redundantly described here. The second embodiment is different from the first embodiment with respect to the process for forming the W plug 17 in the via-hole 15. Therefore, the following description principally deals with the process for forming the W plug 17.

Figure 3:
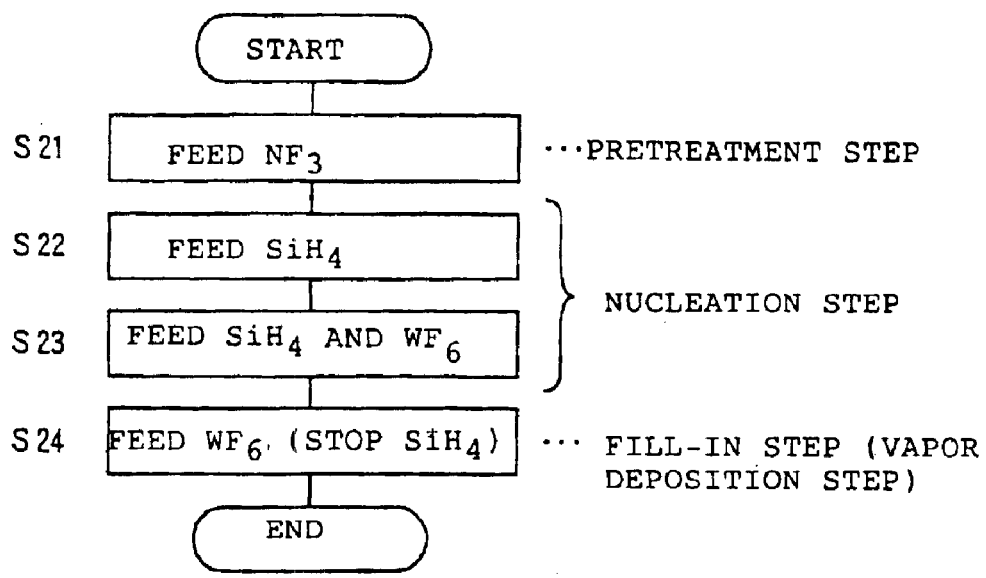
FIG. 3 is a flowchart showing a process for forming the W plug in the via-hole according to a second embodiment of the present invention.

FIG. 3 is a flowchart showing the process for forming the W plug 17 with the gases which are supplied into the via-hole 15.

After the via-hole 15 is formed, the interior (particularly the bottom) of the via-hole 15 is cleaned by a sputtering process using, for example, Ar gas, and an adhesive layer 16 is then formed over the wall of the via-hole 15. Subsequently, the interior (particularly the bottom) of the via-hole 15 is further cleaned by a pre-treatment step. A W portion 17 is then formed by a CVD process to fill the via-hole 15. The pre-treatment step is performed by using a $NF_3$ gas in the second embodiment. The $NF_3$ gas has a strong reducing and cleaning function.

As mentioned above, the $NF_3$ gas is fed to a W forming chamber (sub-step 21) prior to the CVD process. This pre-treatment cleaning step completely removes the substances 9 from the via-hole 15. Subsequent to the cleaning step, a nucleation step (sub-steps S22 and S23) and a W deposition step (sub-step S24) are conducted in that order in the same manner as the conventional method (FIG. 6 and FIG. 7).

Figure 7:
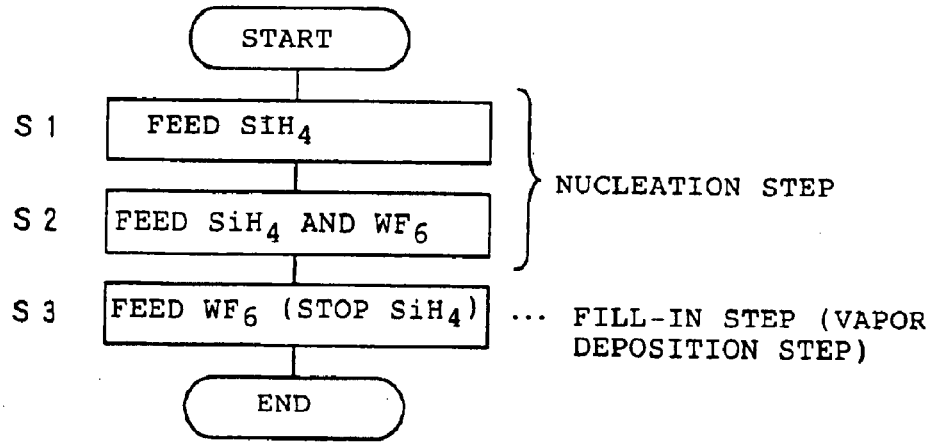
FIG. 7 illustrates a flowchart of a process for forming a W plug in a via-hole of the semiconductor element shown in FIG. 6.

Since the above-described procedure is employed, the following advantages can be obtained as compared with the conventional method (FIG. 6 and FIG. 7).

According to the conventional method, the substances 9 such as TiOx, which create a high resistance, remain at the bottom of the via-hole 5 after the via-hole 5 is created in the conventional method. As a result, the semiconductor element has a high resistance at the via-hole 5. According to the second embodiment, however, the Ar gas is supplied into the via-hole 15 to remove the substances 9 before the adhesive layer 16 is formed, and the $NF_3$ gas is fed into the via-hole 15 to completely clean the substances 9 (sub-step S21) before the via-hole 15 is filled with the W portion 17. Therefore, the substances 9 do not remain in the via-hole at the time of sub-steps S22 and S23. The $NF_3$ gas has a cleaning effect with a strong reducing function. Thus, the product (semiconductor element) can have a low resistance.

Third Embodiment

A third embodiment of the present invention will now be described with reference to FIG. 1 and FIG. 4. A semiconductor element which is fabricated in accordance with the third embodiment is the same as the semiconductor element shown in FIG. 1. Thus, the structure of the semiconductor element will not be redundantly described here. The third embodiment is different from the first and second embodiments with respect to the process for forming the W plug 17 in the via-hole 15. Therefore, the following description principally deals with the process for forming the W plug 17.

Figure 4:
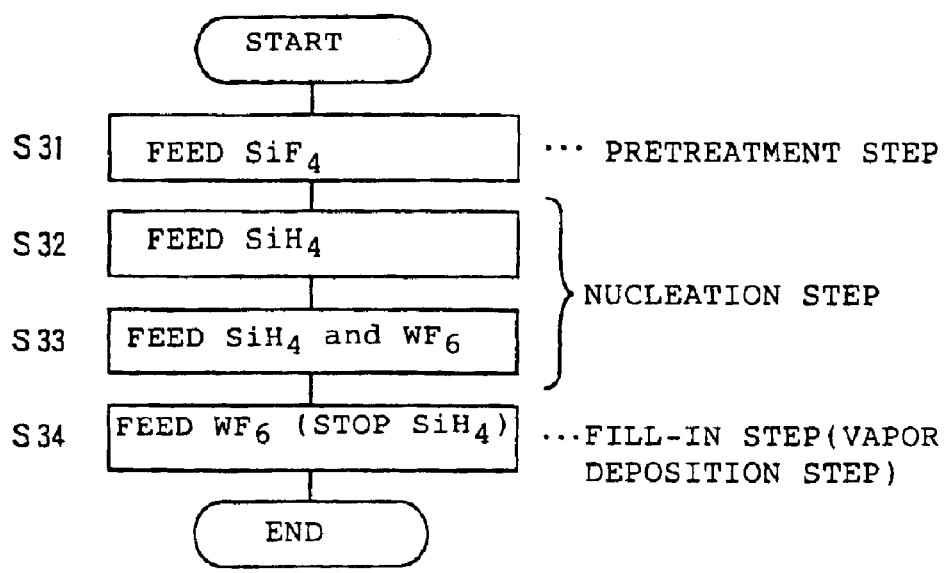
FIG. 4 illustrates a flowchart of a process for forming the W plug in the via-hole according to a third embodiment of the present invention.

FIG. 4 is a flowchart showing the process for forming the W plug 17 with the gases which are supplied into the via-hole 15.

After the via-hole 15 is formed, the interior (particularly the bottom) of the via-hole 15 is cleaned by a sputtering process using, for example, Ar gas, and an adhesive layer 16 is then formed over the wall of the via-hole 15. Subsequently, the interior (particularly the bottom) of the via-hole 15 is further cleaned by a pre-treatment step. A W portion 17 is then formed by a CVD process to fill the via-hole 15. The pre-treatment step is performed by using a $SiF_4$ gas in the third embodiment.

Before the CVD process is conducted, the $SiF_4$ gas is fed to the chamber in the first step (sub-step 31). Subsequently, a nucleation step (sub-steps S32 and S33) and a W deposition step (sub-step S34) are conducted in that order in the same manner as the conventional method (FIG. 6 and FIG. 7).

Since the above-described procedure is employed, the following advantages can be obtained as compared with the conventional method.

The substances 9 (FIG. 6) such as TiOx which create a high resistance remain at the bottom of the via-hole immediately after the formation of the via-hole 5 in the conventional method. The Ar gas is supplied into the via-hole 15 to remove the substances 9 prior to the formation of the adhesive layer 16. However, the removal of the substances 9 by the Ar gas is often insufficient. Therefore, before the via-hole 15 is filled with the W portion 17, the $SiF_4$ gas is supplied into the via-hole 15 (sub-step S31) so as to completely remove the substances 9 from the via-hole 15. The $SiF_4$ gas has a strong reducing function. Thus, the resulting semiconductor element (FIG. 1) has a low resistance.

Fourth Embodiment

A fourth embodiment of the present invention will now be described with reference to FIG. 1 and FIG. 5. A semiconductor element which is fabricated in accordance with the fourth embodiment is the same as the semiconductor element shown in FIG. 1. Thus, the structure of the semiconductor element will not be redundantly described here. The fourth embodiment is different from the foregoing embodiments with respect to the process for forming the W plug 17. Therefore, the following description principally deals with the process for forming the W plug 17.

Figure 5:
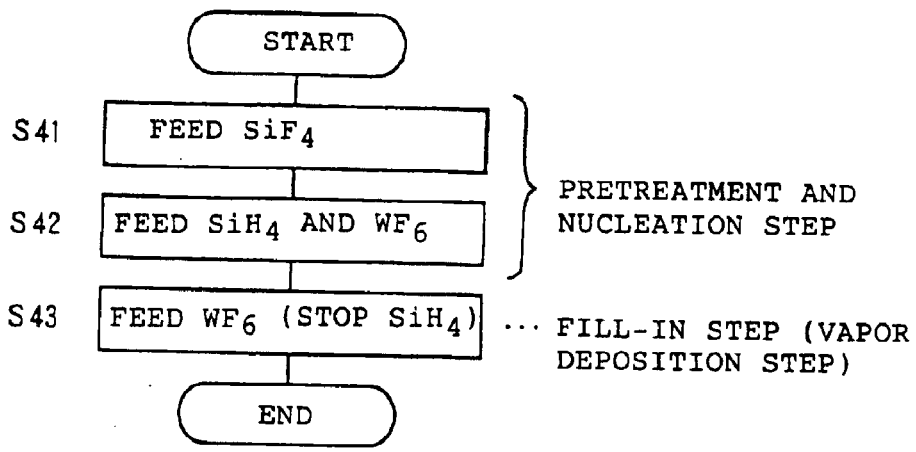
FIG. 5 illustrates a flowchart of a process for forming the W plug in the via-hole according to a fourth embodiment of the present invention.

FIG. 5 is a flowchart showing the process for forming the W plug 17 with the gases which are supplied into the via-hole 15.

After the via-hole 15 is formed, the interior (particularly the bottom) of the via-hole 15 is cleaned by a sputtering process using, for example, Ar gas, and an adhesive layer 16 is formed over the wall of the via-hole 15. Subsequently, the interior (particularly the bottom) of the via-hole 15 is further cleaned by a pre-treatment step. A W portion 17 is then formed by a CVD process to fill the via-hole 15. The pre-treatment cleaning step is performed by using a $SiF_4$ gas in the fourth embodiment.

Before the CVD process is conducted, the $SiF_4$ gas is fed to the chamber in the first step (sub-step 41) to conduct the pre-treatment cleaning. When the $SiF_4$ gas removes the unnecessary substances 9, the $SiF_4$ gas also creates the Si layer. In other words, the pre-treatment and part of the nucleation step (i.e., formation of the Si layer) are carried out at the same time. After the pre-treatment and the Si layer formation, the feeding of the $SiF_4$ gas is stopped, and the $SiH_4$ gas and the $WF_6$ gas are fed into the chamber to complete the nucleation step (sub-step S42). The CVD step for filling the via-hole 15 with W (sub-step S43) is then conducted.

Since the fourth embodiment uses the above-described procedure, the following advantages can be obtained.

The substances 9 (FIG. 6) such as TiOx which create a high resistance often remain at the bottom of the via-hole after the via-hole 5 is created in the conventional method. The Ar gas is supplied into the via-hole 15 to remove the substances 9 prior to the formation of the adhesive layer. However, the removal of the substances 9 by the Ar gas is often insufficient. Therefore, before the via-hole 15 is filled with the W portion, the $SiF_4$ gas is fed into the via-hole 15 (sub-step S41) to completely remove the substances 9 from the bottom of the via-hole. The $SiF_4$ gas has a strong reducing function. Thus, the resulting semiconductor element has a low resistance.

Furthermore, in the fourth embodiment, the Si layer is formed in the via-hole 15 by the $SiF_4$ gas while the inside of the via-hole 15 is being cleaned by the $SiF_4$ gas. That is, the cleaning can be performed together with part of the nucleus forming process. Subsequently, the remainder of the nucleus forming process is completed, and the W deposition step is conducted. It should be noted that the present invention is not limited to the illustrated and described embodiments. Various modifications and changes can be made within the scope of the present invention, and such modifications are also included in the scope of the present invention.

What is claimed is:

1. A method of manufacturing a semiconductor element having at least a substrate, a lower wiring layer, an upper wiring layer, a via-hole connecting the lower wiring layer to the upper wiring layer, and a W material filled in the via-hole, said method comprising:

forming the lower wiring layer on top of the substrate;

forming the via-hole to extend upwardly from the lower wiring layer;

feeding a single fluorine compound gas having a reducing function into the via-hole;

forming a W nucleus in the via-hole;

filling the via-hole with W; and forming the upper wiring layer.

2. The method of manufacturing a semiconductor element according to claim 1, wherein the fluorine compound gas additionally has a cleaning function.

3. The method of manufacturing a semiconductor element according to claim 1, wherein the fluorine compound gas is a $WF_6$ gas.

4. The method of manufacturing a semiconductor element according to claim 1, wherein the fluorine compound gas is a $NF_3$ gas.

5. The method of manufacturing a semiconductor element according to claim 1, wherein the fluorine compound gas is a $SiF_4$ gas.

6. The method of manufacturing a semiconductor element according to claim 1, wherein said filling of the via-hole with W is performed by a CVD process.

7. The method of manufacturing a semiconductor element according to claim 1, wherein said forming of the W nucleus in the via-hole includes feeding a $SiH_4$ gas and a $WF_6$ gas into the via-hole.

8. The method of manufacturing a semiconductor element according to claim 1, further comprising forming a first insulation layer between the substrate and the lower wiring layer.

9. The method of manufacturing a semiconductor element according to claim 8, further comprising forming a second insulation layer between the lower wiring layer and the upper wiring layer, wherein said forming of the via-hole causes the via-hole to extend into the second insulation layer.

10. The method of manufacturing a semiconductor element according to claim 1, further comprising performing a sputtering process and forming an adhesive layer on the via-hole after the via-hole is formed in said forming of the via-hole and before said feeding of the single fluorine compound gas.

11. A method of manufacturing a semiconductor element having at least a substrate, a lower wiring layer, an upper wiring layer, a via-hole connecting the lower wiring layer to the upper wiring layer, and a W material filled in the via-hole, said method comprising:

forming the lower wiring layer on top of the substrate;

forming the via-hole to extend upwardly from the lower wiring layer;

feeding a single fluorine compound gas into the via-hole to clean the via-hole and to form a part of a W nucleus in the via-hole, the fluorine compound gas having a reducing function and a cleaning function;

forming the remaining part of the W nucleus;

filling the via-hole with W; and forming the upper wiring layer.

12. A The method of manufacturing a semiconductor element according to claim 11, wherein the fluorine compound gas is a $SiF_4$ gas.

13. The method of manufacturing a semiconductor element according to claim 11, wherein said filling of the via-hole with W is performed by a CVD process.

14. The method of manufacturing a semiconductor element according to claim 11, wherein said forming of the remaining part of the W nucleus includes feeding a $SiH_4$ gas and a $WF_6$ gas into the via-hole.

15. The method of manufacturing a semiconductor element according to claim 11, further comprising forming a first insulation layer between the substrate and the lower wiring layer.

16. The method of manufacturing a semiconductor element according to claim 15, further comprising forming a second insulation layer between the lower wiring layer and the upper wiring layer, wherein said forming of the via-hole causes the via-hole to extend into the second insulation layer.

17. The method of manufacturing a semiconductor element according to claim 11, further comprising performing a sputtering process to clean the via-hole and forming an adhesive layer on the via-hole after the via-hole is formed in said forming of the via-hole and before said feeding of the single fluorine compound gas.

18. The method of manufacturing a semiconductor element according to claim 11, wherein the part of the W nucleus formed in said feeding of the single fluorine compound gas into the via-hole is a Si layer.

19. A method of manufacturing a semiconductor element having at least a substrate, a lower wiring layer, an upper wiring layer, a via-hole connecting the lower wiring layer to the upper wiring layer, and a W material filled in the via-hole, said method comprising:

forming the lower wiring layer on top of the substrate;

forming the via-hole to extend upwardly from the lower wiring layer;

feeding a single fluorine compound gas into the via-hole to clean the via-hole and to form a part of a W nucleus in the via-hole, the fluorine compound gas having a reducing function and a cleaning function;

feeding a $SiH_4$ gas and a $WF_6$ gas into the via-hole to form the remaining part of the W nucleus;

filling the via-hole with W by a CVD process; and forming the upper wiring layer.

20. The method of manufacturing a semiconductor element according to claim 19, further comprising performing a sputtering process to clean the via-hole and forming an adhesive layer on the via-hole after the via-hole is formed in said forming of the via-hole and before said feeding of the single fluorine compound gas.

* * * * *